United States Patent
Tsuneda et al.

(10) Patent No.: US 7,265,446 B2
(45) Date of Patent: Sep. 4, 2007

(54) MOUNTING STRUCTURE FOR SEMICONDUCTOR PARTS AND SEMICONDUCTOR DEVICE

(75) Inventors: Kensuke Tsuneda, Tokyo (JP); Atsushi Nakamura, Tokyo (JP); Seiichiro Tsukui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/957,739

(22) Filed: Oct. 5, 2004

(65) Prior Publication Data

US 2005/0104212 A1 May 19, 2005

(30) Foreign Application Priority Data

Oct. 6, 2003 (JP) ............... 2003-346838
Aug. 2, 2004 (JP) ............... 2004-225556

(51) Int. Cl.
   *H01L 23/48* (2006.01)
(52) U.S. Cl. .................................... 257/734
(58) Field of Classification Search ........ 257/734–738, 257/700, 686, 777, E23.069
See application file for complete search history.

(56) References Cited

U.S. PATENT DOCUMENTS

| | | | |
|---|---|---|---|
| 6,313,522 B1 * | 11/2001 | Akram et al. ............ | 257/686 |
| 6,618,267 B1 * | 9/2003 | Dalal et al. ............. | 361/767 |
| 6,798,070 B2 * | 9/2004 | Funaya et al. ........... | 257/777 |
| 6,836,011 B2 * | 12/2004 | Azuma .................. | 257/700 |
| 6,952,049 B1 * | 10/2005 | Ogawa et al. ............ | 257/700 |
| 2003/0214049 A1 * | 11/2003 | Hortaleza et al. ......... | 257/778 |
| 2003/0218235 A1 * | 11/2003 | Searls et al. ............. | 257/532 |
| 2004/0155335 A1 * | 8/2004 | Searls et al. ............. | 257/734 |
| 2004/0169277 A1 * | 9/2004 | Matsuda ................ | 257/737 |
| 2004/0173891 A1 * | 9/2004 | Imai et al. .............. | 257/686 |
| 2004/0178508 A1 * | 9/2004 | Nishimura et al. ........ | 257/778 |
| 2004/0188826 A1 * | 9/2004 | Palanduz et al. .......... | 257/700 |
| 2004/0235287 A1 * | 11/2004 | Inoue et al. ............. | 438/612 |
| 2004/0238942 A1 * | 12/2004 | Chakravorty et al. ...... | 257/700 |
| 2004/0262774 A1 * | 12/2004 | Kang et al. ............. | 257/777 |
| 2005/0006784 A1 * | 1/2005 | Nakayama .............. | 257/777 |
| 2005/0051903 A1 * | 3/2005 | Ellsberry et al. .......... | 257/777 |
| 2005/0082669 A1 * | 4/2005 | Saijo et al. ............. | 257/737 |
| 2005/0199991 A1 * | 9/2005 | Chao et al. ............. | 257/686 |
| 2006/0068523 A1 * | 3/2006 | Lin ..................... | 438/109 |

FOREIGN PATENT DOCUMENTS

JP    4-62866    2/1992

* cited by examiner

*Primary Examiner*—Nathan W. Ha
(74) *Attorney, Agent, or Firm*—McGinn IP Law Group, PLLC

(57) ABSTRACT

To arrange semiconductor parts such as chip resistors and the like between a BGA and a mounting substrate, an interposes is disposed between the BGA and the mounting substrate for mounting the BGA thereon. The interposer serves to maintain the distance between the mounting substrate and the BGA to be just as large as or larger than the thickness of the semiconductor parts and to electrically connect solder balls of the BGA and electrically conductive patterns of the mounting substrate. The semiconductor parts are mounted on the mounting substrate before fixing the BGA 22 to the interposer.

12 Claims, 3 Drawing Sheets

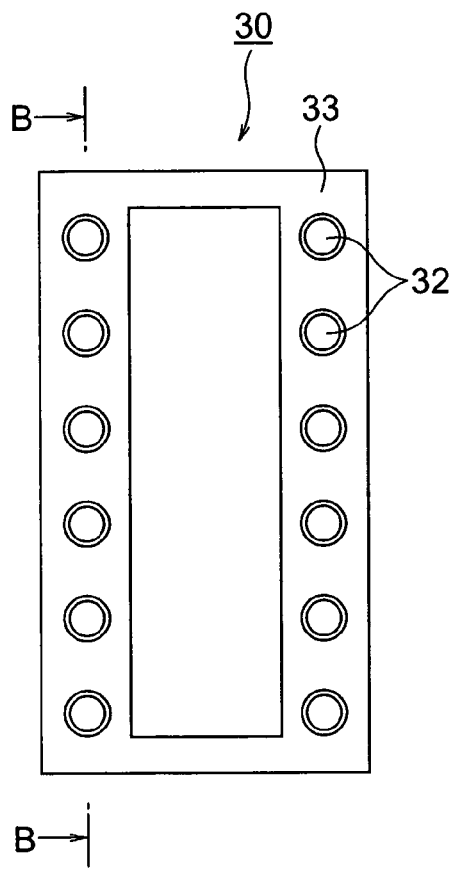
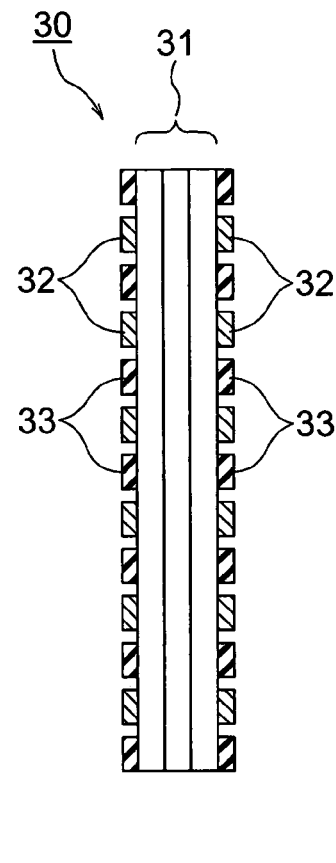
FIG. 3A  FIG. 3B
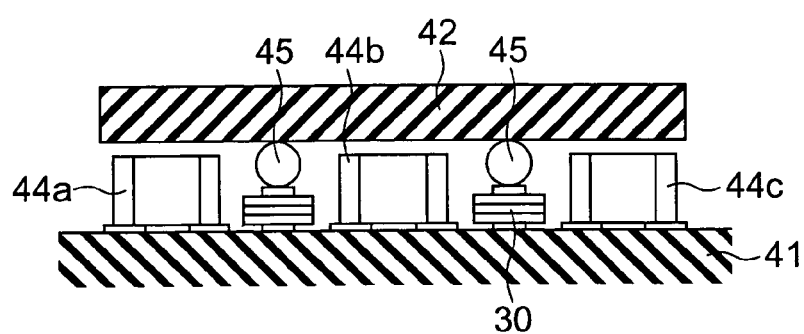
FIG. 4

MOUNTING STRUCTURE FOR SEMICONDUCTOR PARTS AND SEMICONDUCTOR DEVICE

This application claims priority to prior Japanese application JP 2004-225556, the disclosure of which is incorporated herein by reference.

BACKGROUND OF THE INVENTION

The present invention relates to a semiconductor device including a plurality of semiconductor parts mounted on a mounting substrate, and more particularly to a mounting structure for the semiconductor parts.

In order to comply with the requirement with respect to miniaturization of semiconductor devices in recent years, there have been semiconductor devices in which a plurality of semiconductor parts are mounted in an overlapping relationship to each other on a mounting substrate to minimize the mounted area of the semiconductor parts.

A related semiconductor device has a spacer between a mounting substrate and a semiconductor integrated circuit board. Because the mounting substrate and the semiconductor integrated circuit board are electrically connected to each other by means of bonding wires, a distance (i.e. a thickness of the spacer) between the mounting substrate and the semiconductor integrated circuit board can be comparatively freely designed.

In contrast herewith, as BGA (ball grid array) is electrically connected to a mounting substrate by the use of a plurality of solder balls formed in arrangement on the lower surface of a package, the distance between the BGA and the mounting substrate cannot be freely designed. In usual, diameters of solder balls of BGA are 0.4 mm to 0.5 mm, and distances between the BGA and the mounting substrate is 0.3 mm to 0.4 mm when the BGA is mounted on the mounting substrate. In the case of chip parts, on the other hand, the maximum values are 0.55 mm with type 1005 mainly used at present and 0.33 mm with small type 0603. In the most cases, therefore, the distance between the BGA and the mounting substrate is less than the thickness of the chip parts (or semiconductor parts). Consequently, the chip parts could not be disposed between the BGA and the mounting substrate.

SUMMARY OF THE INVENTION

It is, therefore, an object of the invention to provide a mounting structure for semiconductor parts and a semiconductor device with the mounting structure, which makes it possible to arrange semiconductor parts such as chip resistors and the like between a BGA and a mounting substrate.

The present invention provides a mounting structure for semiconductor parts characterized in that an interposer is disposed between a BGA and a mounting substrate for mounting the BGA thereon. Therefore, the existence of the interposer makes it possible to dispose some or all of the semiconductor parts between the BGA and the mounting substrate.

The interposer comprises mounting pads for electrically connecting balls formed on the lower surface of the BGA and electrically conductive patterns formed on the upper surface of the mounting substrate.

The interposer is preferably formed of a multilayer circuit board.

Moreover, the present invention provides a semiconductor device characterized in comprising an interposer between a BGA and a mounting substrate for mounting the BGA thereon.

BRIEF DESCRIPTION OF THE DRAWINGS

FIG. 3A is a plan view of an interposer to be used in a mounting structure according to one embodiment of the invention;

FIG. 3B is a sectional view taken along a B-B line of FIG. 3A;

FIG. 4 is a longitudinal sectional view of a semiconductor device employing the mounting structure for semiconductor parts according to the one embodiment of the invention;

PREFERRABLE EMBODIMENTS

The description will be at first directed to a related semiconductor device for good understanding of this invention.

Figure 1:
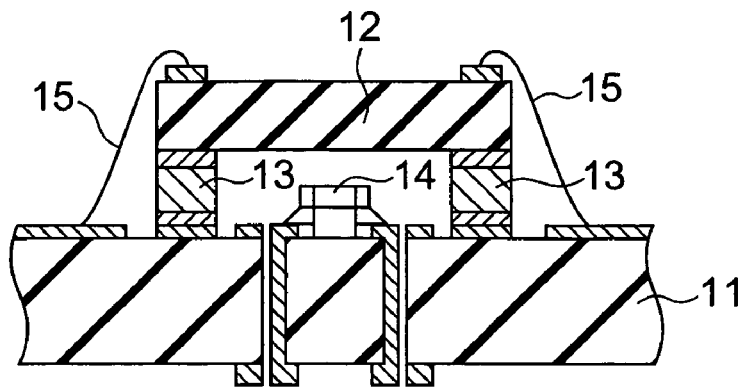
FIG. 1 is a longitudinal sectional view of a related semiconductor device.
Figure 2:
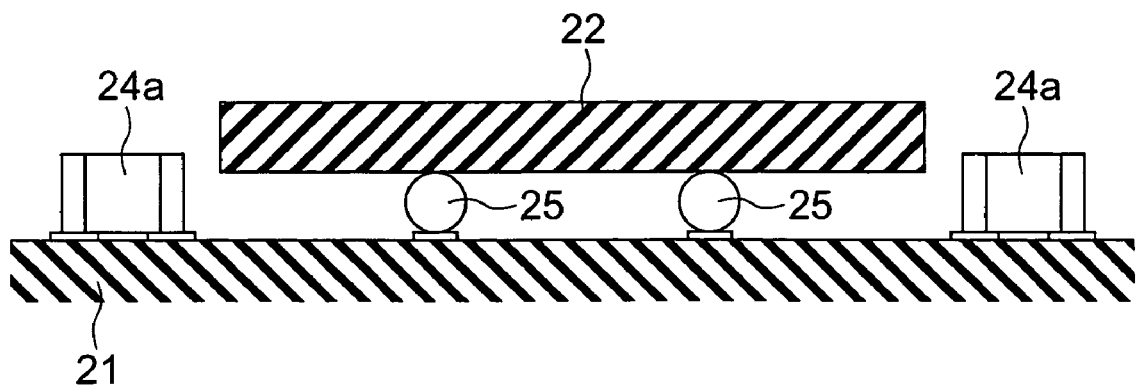
FIG. 2 shows physical relationship between a BGA and chip parts on a mounting substrate.

As shown in FIG. 1, the related semiconductor device includes a mounting substrate 11, a semiconductor integrated circuit board 12, a spacer 13 and a chip part 14.

The spacer 13 is disposed between the mounting substrate 11 and the semiconductor integrated circuit board 12 to form a space between them. The chip part 14 is arranged on the mounting substrate 11 in the space formed by the mounting substrate 11 and the semiconductor integrated circuit board 12.

To electrically connect integrated circuit on the semiconductor integrated circuit board 12 to conductive patterns on the mounting substrate 11, bonding wires 15 are used. If the spacer 13 is made of conductive material, it is possible to electrically connect a lower surface of the semiconductor integrated circuit board 12 to the conductive patterns on the mounting substrate 11 by applying solder or electrically conductive adhesive between the spacer 13 and both the mounting substrate 11 and the semiconductor integrated circuit board 12.

Such a semiconductor device is disclosed in Unexamined Japanese Patent Publication No. 62,866/1992.

In the related semiconductor device, the banding wires 15 are used for electric connection between the mounting substrate 11 and the semiconductor integrated circuit board 12. Accordingly, a distance between the mounting substrate 11 and the semiconductor integrated circuit board 12 can be comparatively freely changed by changing thickness of spacer 13.

On the other hand, a BGA (ball grid array) is electrically connected to a mounting substrate by solder balls. That is, the solder balls of the BGA define the distance between the mounting substrate and the BGA. Accordingly, it is Impossible to form a space for chip parts (or semiconductor parts) between the mounting substrate and the BGA. As shown FIG. 4, the chip parts 24a, 24b could not be disposed between the mounting substrate 21 and the BGA 22. This is because the distance defined by solder balls 25 between the mounting substrate 21 and the BGA 22 is smaller than a thickness of the chip parts 24a, 24b.

Referring to FIGS. 3A, 3B and 4, the description will be made about a semiconductor device employing a mounting structure according to an embodiment of this invention.

FIG. 3A is a plan view of an interposer 30 to be used in the semiconductor device and FIG. 3B is a sectional view taken along a B-B line of FIG. 3A.

As shown in FIGS. 3A and 3B, the interposer 30 is a multilayer thin board or a multilayer tape of the order of 0.2 mm to 0.3 mm thickness using rectangular frames-shaped base materials 31 made of glass epoxy resin or the like. The interposer 30 is formed on its both surfaces with a plurality of BGA mounting pads 32 and solder resists 33.

The BGA mounting pads 32 of the interposer 30 are formed in the positions corresponding to solder balls (referred to hereinafter as merely "balls") formed on the lower surface of BGA (ball grid array) explained later. Moreover, electrically connected to each other are the BGA mounting pads 32 on the front side (or the left-hand side of FIG. 3B) and the BGA mounting pads 32 on the rear side (or the right-hand side of FIG. 3B) positioned correspondingly to each other.

On the other hand, the solder resists 33 are formed on regions except for the regions formed with the BGA mounting pads 32 and their peripheries. The solder resists 33 serve to prevent any electrical connection between the balls when the BGA is loaded.

FIG. 4 shows a sectional view of the semiconductor device having the interposer 30 of FIGS. 3A and 3B.

As illustrated in FIG. 4, the semiconductor device comprises a mounting substrate 41, and a BGA 42 and semiconductor parts 44a-44c mounted on the upper surface of the mounting substrate 41. The interposer 30 is also provided between the mounting substrate 41 and the BGA 42.

The semiconductor device may be produced in a manner that the interposer 30 is connected and fixed onto the mounting substrate 41 and the semiconductor parts 44a-44c are loaded on the mounting substrate 41 and thereafter the BGA 42 is connected and fixed to the interposer 30.

The mounting pads 32 on the lower (or rear) surface of the interposer 30 are each connected and fixed by means of soldering or joining by the use of an electrically conductive adhesive to a conductive pattern which has been formed on the upper surface of the mounting substrate 41 so as to be electrically connected to each of the balls 45 formed on the lower surface of the BGA 42. The balls 45 formed on the lower surface of the BGA 42 are also connected and fixed to the BGA mounting pads 32 on the upper (or front) surface of the interposer 30.

The interposer 30 serves as a spacer between the mounting substrate 41 and the BGA 42 to maintain the distance between then to be just as large as or larger than the thickness of the semiconductor parts 44a-44c. The thickness of the interposer 30 may be determined in consideration of deformation of the balls 45 and the like when the BGA 42 is mounted. For example, when the diameter of a ball 45 on the BGA 42 is 0.4 mm and the thickness of the interposer 30 is 0.2 mm, their total becomes 0.4 mm+0.2 mm=0.6 mm which is larger than the height (0.55 mm) of the chip parts of type 1005. A thickness of the order of 0.3 mm is required to ensure the electrical connection between the balls 45 and the BGA mounting pads 32. The interposer 30 is easy to change its thickness by varying the number of layers of its multilayer construction.

Semiconductor parts 44a-44c to be loaded on the mounting substrate 41 include chip capacitors, chip resistors (terminating resistors) as well as thin type IC packages.

According to the embodiment of the invention, as the semiconductor parts can be arranged between the BGA and the mounting substrate, the mounting or packaging density of the mounting substrate can be increased. In the case that the semiconductor parts are power decoupling capacitors, particularly, they can be disposed in the proximity of power source pins of the BGA, which is advantageous for the electric characteristics.

Figure 5:
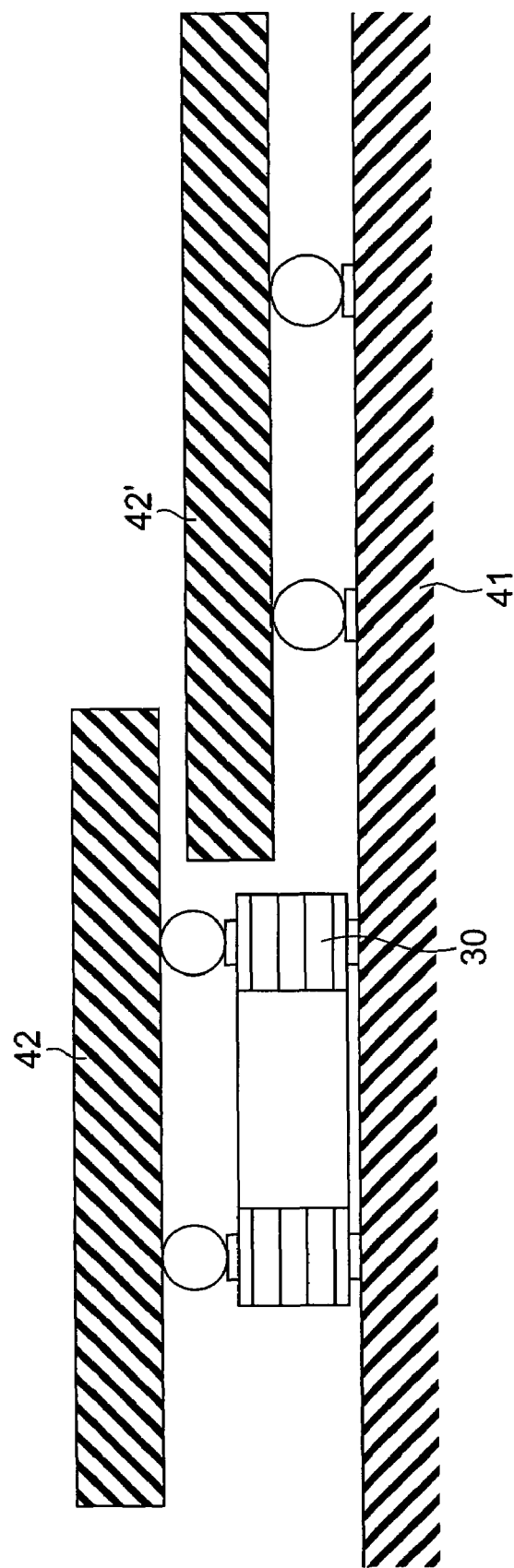
FIG. 5 is a longitudinal sectional view illustrating another example of a semiconductor device employing a mounting structure for semiconductor parts according to the invention.

Although all the semiconductor parts are positioned immediately below the BGA in the illustrated embodiment of the invention described above, it is to be understood that even if some of the semiconductor parts may be positioned immediately below the BGA and the remaining parts may be positioned outside the region immediately below the BGA, the mounting or packaging density can be increased to some extent. Similarly, additional BGA 42' may be partially placed below the BGA 42 in place of the chip device(s) as illustrated in FIG. 5. In this case, the thickness of the interposer 30 is increased if necessary.

What is claimed is:

1. A mounting structure for semiconductor parts comprising:
   an interposer disposed between a ball grid array (BGA) and a mounting substrate for mounting the BGA thereon,
   wherein balls formed on a lower surface of the BGA and electrically conductive patterns formed on an upper surface of the mounting substrate are electrically connected to each other by mounting pads formed on the interposer,
   wherein at least some of the semiconductor parts are disposed between the BGA and the mounting substrate,
   wherein said mounting pads are disposed along said interposer at positions corresponding to positions of said balls, and
   wherein said solder resists are formed along said interposer at positions, adjacent to said mounting pads, other than those that correspond to the positions of said balls.

2. The mounting structure for semiconductor parts as set forth in claim 1, wherein the interposer comprises a multilayer circuit board.

3. The mounting structure for semiconductor parts as set forth in claim 1, wherein said interposer comprises a thickness equal to 0.2 mm or more.

4. The mounting structure for semiconductor parts as set forth in claim 1,
   wherein said interposer comprises mounting pads formed along a top surface of said interposer and mounting pads formed along a bottom surface of said interposer, and
   wherein said mounting pads formed along a top surface of said interposer and said mounting pads formed along a bottom surface of said interposer are electrically connected to one another.

5. The mounting structure for semiconductor parts as set forth in claim 1, wherein said interposer is fixed to a surface of the mounting substrate.

6. The mounting structure for semiconductor parts as set forth in claim 1, wherein a thickness of said interposer is sufficiently large to provide a space between the BGA and the mounting substrate, said space being no smaller than a thickness of the semiconductor parts.

7. The mounting structure for semiconductor parts as set forth in claim 1, wherein a combined thickness of said interposer and the balls is at least as large as a thickness of the semiconductor parts.

8. The mounting structure for semiconductor parts as set forth in claim 1, wherein said interposer comprises at least one of a multilayer thin board and a multilayer tape.

9. The semiconductor device according to claim 1, wherein said mounting pads and said solder resists are alternately formed along a top surface and a bottom surface of said interposer.

10. A semiconductor device comprising:
an interposer between a ball grid array (BGA) and a mounting substrate for mounting the BGA thereon,
wherein balls formed on a lower surface of the BGA and electrically conductive patterns formed on an upper surface of the mounting substrate are electrically connected to each other by mounting pads formed on the interposer,
wherein semiconductor parts are disposed between the BGA and the mounting substrate,
wherein said mounting pads are disposed along said interposer at positions corresponding to positions of said balls, and
wherein said solder resists are formed along said interposer at positions, adjacent to said mounting pads, other than those that correspond to the positions of said balls.

11. The semiconductor device as set forth in claim 10, wherein the interposer comprises a multilayer circuit board.

12. A semiconductor device comprising:
a ball grid array;
a mounting substrate, said mounting substrate being electrically connected to said ball grid array by at least one solder ball; and
an interposer disposed between said ball grid array and said mounting substrate, wherein said interposer comprises a thickness sufficient to provide a space for arranging semiconductor parts between said ball grid array and said mounting substrate,
wherein balls formed on a lower surface of the BGA and electrically conductive patterns formed on an upper surface of the mounting substrate are electrically connected to each other by mounting pads formed on the interposer,
wherein said semiconductor parts are disposed between the BGA and the mounting substrate,
wherein said mounting pads are disposed along said interposer at positions corresponding to positions of said balls, and
wherein said solder resists are formed along said interposer at positions, adjacent to said mounting pads, other than those that correspond to the positions of said balls.

* * * * *

UNITED STATES PATENT AND TRADEMARK OFFICE
CERTIFICATE OF CORRECTION

PATENT NO. : 7,265,446 B2  Page 1 of 1
APPLICATION NO. : 10/957739
DATED : September 4, 2007
INVENTOR(S) : Kensuke Tsuneda, Atsushi Nakamura and Seiichiro Tsukui It is certified that error appears in the above-identified patent and that said Letters Patent is hereby corrected as shown below:

Title Page should read

(73) Assignee:  Elpida Memory, Inc. Tokyo (JP)

Renesas Eastern Japan Semiconductor, Inc. Tokyo (JP)

Renesas Technology Corp. Tokyo (JP)

Signed and Sealed this

Seventh Day of October, 2008

JON W. DUDAS
*Director of the United States Patent and Trademark Office*